(12) United States Patent
Nihashi

(10) Patent No.: US 8,618,699 B2
(45) Date of Patent: Dec. 31, 2013

(54) INFORMATION PROCESSING TERMINAL AND METHOD FOR PREVENTING AN ELECTRIC SHOCK FROM THE INFORMATION PROCESSING TERMINAL

(75) Inventor: Kiyotaka Nihashi, Shizuoka (JP)

(73) Assignee: Toshiba Tec Kabushiki Kaisha, Tokyo (JP)

( * ) Notice: Subject to any disclaimer, the term of this patent is extended or adjusted under 35 U.S.C. 154(b) by 671 days.

(21) Appl. No.: 12/917,736

(22) Filed: Nov. 2, 2010

(65) Prior Publication Data

US 2011/0204730 A1 Aug. 25, 2011

(30) Foreign Application Priority Data

Feb. 25, 2010 (JP) .................................. 2010-40187

(51) Int. Cl.
*H02H 11/00* (2006.01)
(52) U.S. Cl.
USPC .......................................................... 307/326

(58) Field of Classification Search
USPC .......................................................... 307/326
See application file for complete search history.

(56) References Cited

FOREIGN PATENT DOCUMENTS

| JP | 03-234691 | 10/1991 |
|---|---|---|
| JP | 05-226026 | 9/1993 |
| JP | 11-149330 | 6/1999 |

*Primary Examiner* — Hal Kaplan
(74) *Attorney, Agent, or Firm* — Turocy & Watson, LLP

(57) ABSTRACT

According to one embodiment, an information processing terminal includes a power supply for supplying electric power, an inlet connected to a power cord for supplying electric power to the power supply, an electronic board on which an arithmetic unit is mounted, and a body cover which covers a body including at least the power supply and the electronic board. The information processing terminal further includes a covering member disposed in the body or the body cover, the covering member being displaced to expose one of the inlet and at least one locking member, which should be removed to take the body cover out of the body, while covering the other.

20 Claims, 15 Drawing Sheets

INFORMATION PROCESSING TERMINAL AND METHOD FOR PREVENTING AN ELECTRIC SHOCK FROM THE INFORMATION PROCESSING TERMINAL

CROSS-REFERENCE TO RELATED APPLICATIONS

This application is based upon and claims the benefit of priority from Japanese Patent Application No. 2010-040187, filed on Feb. 25, 2010, the entire contents of which are incorporated herein by reference.

FIELD

Embodiments described herein relate generally to an information processing terminal which may prevent an electric shock and a method for preventing an electric shock from the information processing terminal.

BACKGROUND

Information processing terminals such as personal computers and point-of-sales (POS) terminals operate with a high voltage of 100 V to 240 V supplied from an external power source through an inlet.

For the purpose of repair, such an information processing terminal may be uncovered to expose its internal electronic components. However, an information processing terminal in the related art can be uncovered while a power cord of an external power source is plugged into an inlet of the terminal. With such a configuration, an operator may receive an electric-shock when the operator contacts internal circuitry of the terminal.

In this regard, there has been proposed a technique in which a portion of a bottom plate covering internal electronic components covers an inlet so that the bottom plate can not be separated from the body unless a power cord is disconnected from the inlet.

However, such technique has a problem of increasing manufacturing costs since even a slight model change may require the mold of the bottom plate to be newly prepared.

DETAILED DESCRIPTION

According to one illustrative embodiment, an information processing terminal includes a power supply for supplying electric power, an inlet connected to a power cord for supplying electric power to the power supply, an electronic board on which an arithmetic unit is mounted, and a body cover which covers a body including at least the power supply and the electronic board. The information processing terminal further includes a covering member disposed in the body or the body cover and displaced to expose one of the inlet and at least one locking member to be removed to take the body cover out of the body and to cover the other. According to one illustrative embodiment, an information processing terminal and a method for preventing an electric shock from the information processing terminal will be described with reference to the drawings. In the following description, it is assumed that an information processing terminal includes at least one of a computer, a personal computer and a POS terminal.

First Embodiment

Figure 1:
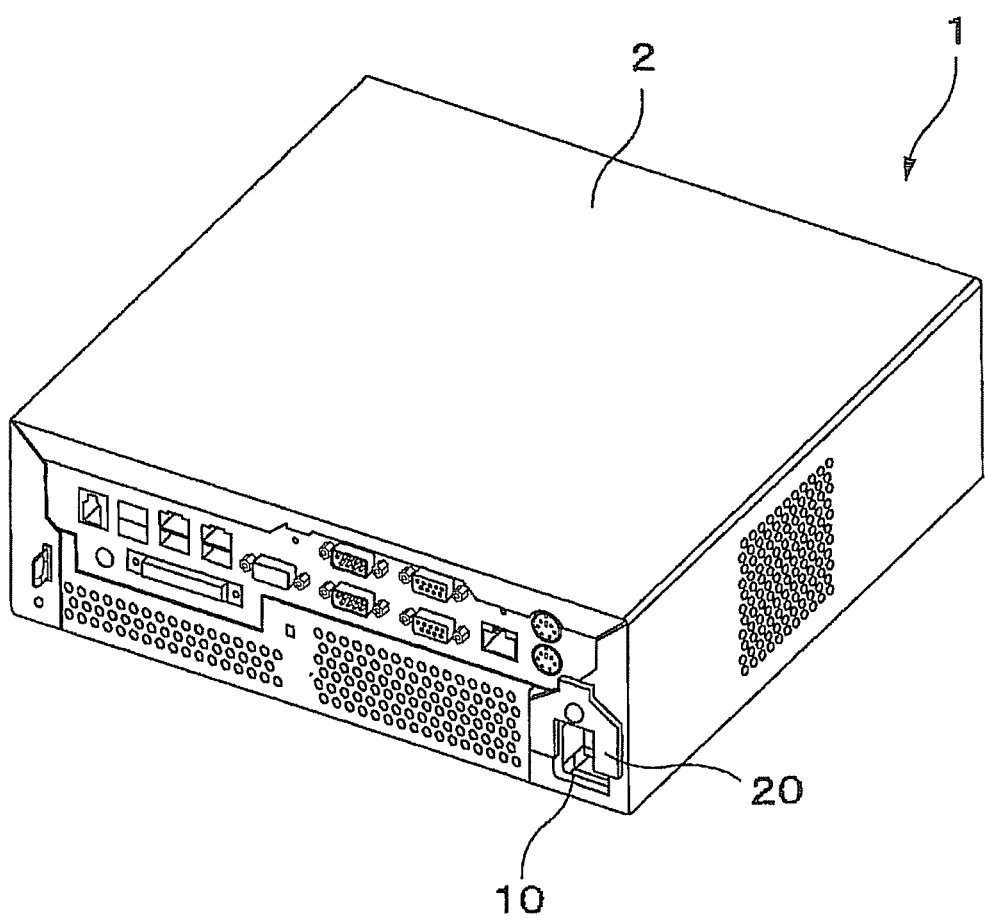
FIG. 1 is a rear perspective view of an information processing terminal according to a first embodiment.

FIG. 1 is a rear perspective view of an information processing terminal 1 according to a first embodiment. As shown in FIG. 1, the information processing terminal 1 includes a body which electronic components are mounted in, a body cover 2 which covers the electronic components of the body, and an inlet 10 to which a power cord is connected.

The body cover 2 of the information processing terminal 1 includes a covering member 20 which covers a screw, which is a locking member 11 that should be removed for taking off the body cover 2, when the inlet 10 is exposed, while exposing the locking member when the inlet 10 is covered. The locking member 11 is not shown in FIG. 1 as it is covered by the covering member 20.

In other words, the covering member 20 is displaced to expose one of the inlet 10 and at least one locking member 11, which should be removed to take off the body cover 2, while covering the other. Here, the displacement includes at least one of rotation, turn and sliding.

Figure 2:
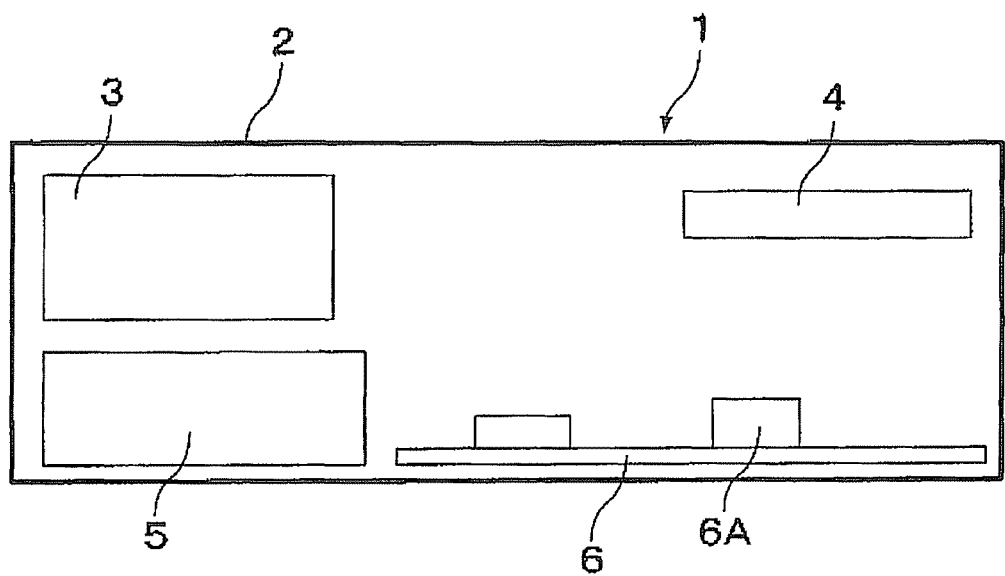
FIG. 2 is a front view showing an internal configuration of the information processing terminal according to the first embodiment.

FIG. 2 is a front view showing an internal configuration of the information processing terminal according to this embodiment. As shown in FIG. 2, the information processing terminal 1 includes an electronic board 6 on which a CPU 6A functioning as an arithmetic unit and a memory are mounted, an optical disk device 5, a hard disk drive 4, which is a mass storage device, a power supply 3 which supplies electric power, and the body cover 2 which covers these electronic components.

The electronic board 6 has input/output interfaces mounted thereon, through which external devices such as a display, a keyboard, a mouse and a cash drawer are connected to the information processing terminal 1.

A signal input from an external input device such as a keyboard is processed by the CPU 6A, and a result of the processing is output to a display and stored in the hard disk drive 4 at an appropriate time.

Figure 3:
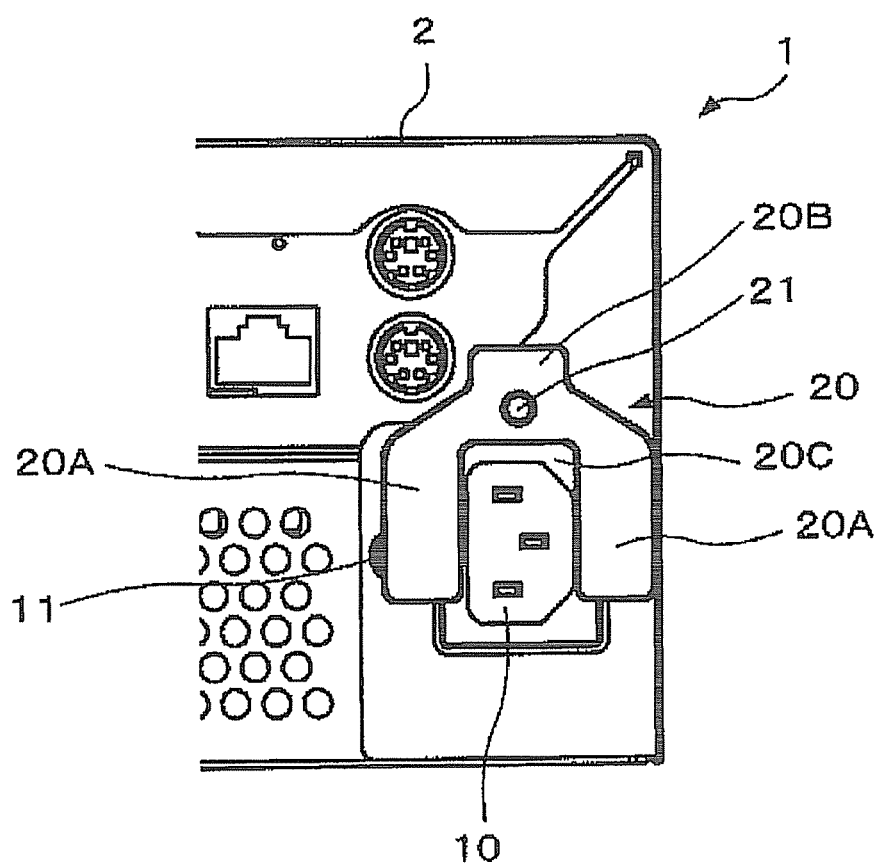
FIG. 3 is a view showing a configuration where a covering member covers a locking member according to the first embodiment.

FIG. 3 is a view showing a configuration where the covering member 20 covers the locking member 11 according to this embodiment. As shown in FIG. 3, the covering member 20 includes first covering parts 20A having a notch 20C which has a width and a height so as to expose the inlet 10 when the locking member 11 is covered, a locking pin 21 which is disposed above the inlet 10 and rotatably locks the covering member 20 to the body or the body cover 2, and a second covering part 20B which is located opposite the first covering parts 20A with the locking pin 21 interposed therebetween.

The two first covering parts 20A have the same shape. The locking pin 21 is disposed at an equal distance from the two first covering parts 20A. That is, the locking pin 21 is disposed on a line symmetrical to an axis of the covering member 20. Thus, when no force is exerted on the covering member 20, the covering member 20 is displaced by virtue of its weight to expose the inlet 10.

The second covering part 20B has a width and a height so as to cover the inlet 10 when the locking member 11 is exposed.

Figure 4:
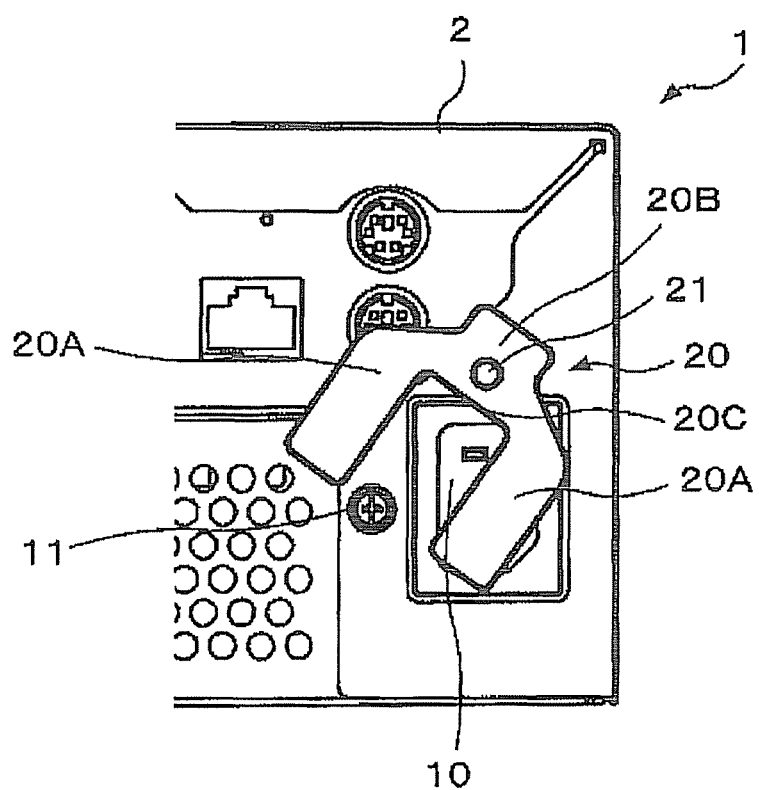
FIG. 4 is a view showing a configuration where a covering member is displaced to expose a locking member according to the first embodiment.
Figure 5:
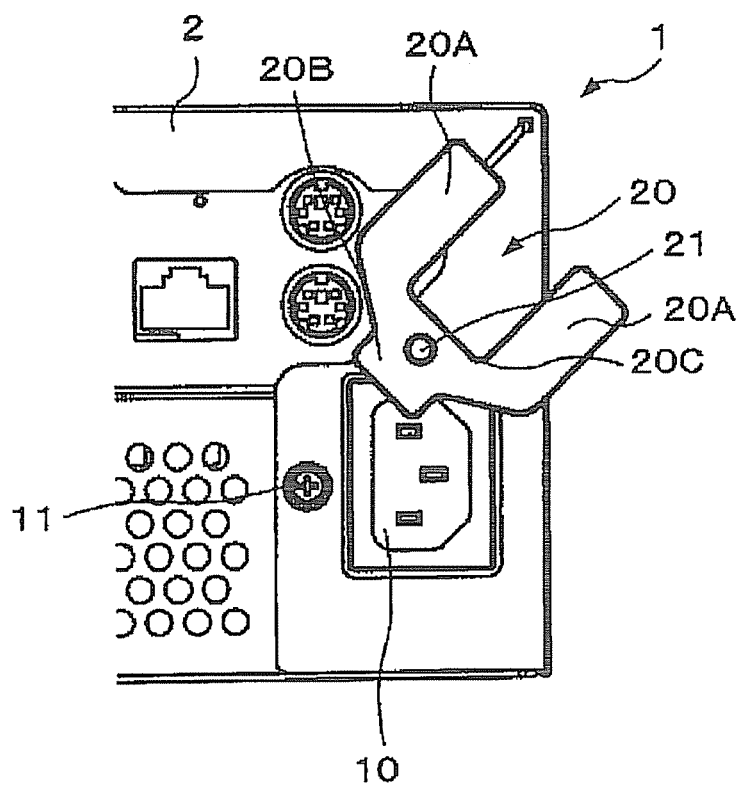
FIG. 5 is a view showing a configuration where a covering member is displaced to expose a locking member according to the first embodiment.

FIGS. 4 and 5 are views showing a configuration where the covering member 20 is displaced to expose the locking member 11. As shown in FIG. 4, if the locking member 11 is exposed, the first covering parts 20A cover the inlet 10.

As shown in FIG. 5, if the covering member 20 is further rotated and displaced, the second covering part 20B covers the inlet 10 while the locking member 11 is exposed.

Figure 6:
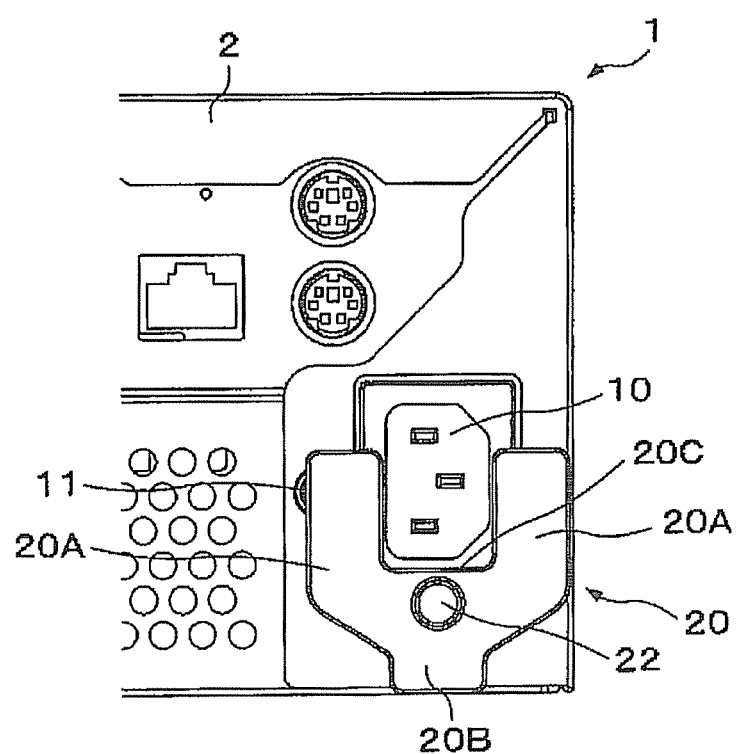
FIG. 6 is a view showing an exemplary configuration where a locking pin of the covering member is disposed below an inlet according to the first embodiment.
Figure 7:
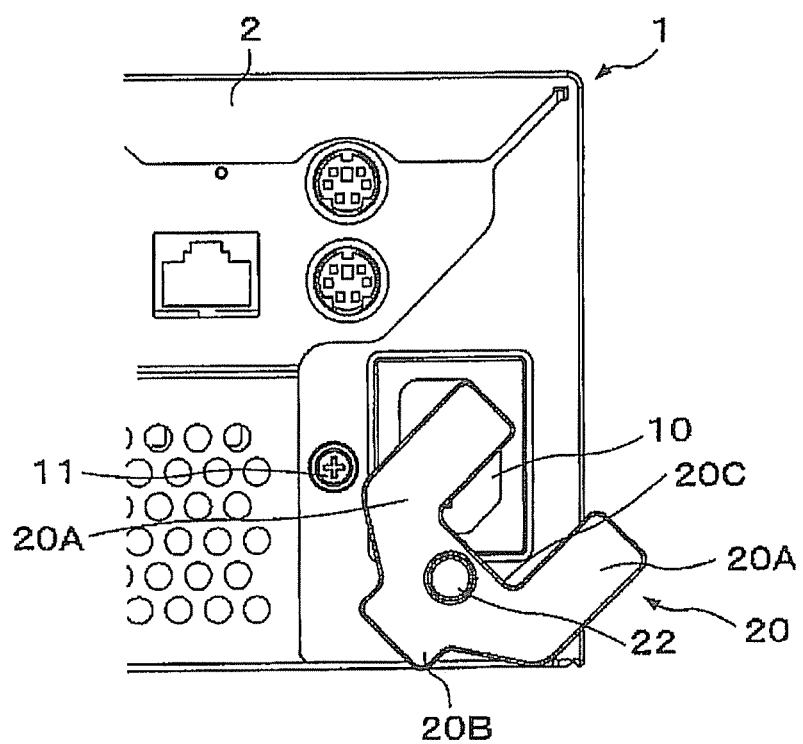
FIG. 7 is a view showing a configuration where the covering member is rotated to expose the locking member according to the first embodiment.

FIG. 6 is a view showing an exemplary configuration where a locking pin 22 of the covering member 20 is disposed below the inlet 10. FIG. 7 is a view showing a configuration where the covering member 20 is rotated to expose the locking member 11.

As shown in FIGS. 6 and 7, even if the locking pin 22 is disposed below the inlet 10, it is possible to obtain the same operational effects as the configuration where the locking member 22 is disposed above the inlet 10. That is, the locking pins 21 and 22 may be disposed above, below or beside the inlet 10.

As described above, the information processing terminal 1 according to this embodiment includes the covering member 20 which includes the first covering parts 20A having the notch 20C which has a width and a height so as to expose the inlet 10, the locking pin 21 which is disposed above the inlet 10 and is rotatably locked to the body cover 2, and the second covering part 20B which is located opposite the first covering parts 20A with the locking pin 21 interposed therebetween. In this embodiment, the covering member 20 is displaced to expose one of the inlet 10 and at least one locking member 11, which should be removed to take off the body cover 2, while covering the other.

Accordingly, when an operator attempts to remove the locking member 11 to take off the body cover 2, the operator has to disconnect the power cord from the inlet 10, which may prevent an electric shock.

Second Embodiment

An information processing terminal 1 according to a second embodiment has the same internal configuration as that of the first embodiment, and therefore, explanation of the internal configuration will be omitted for the sake of brevity.

Figure 8:
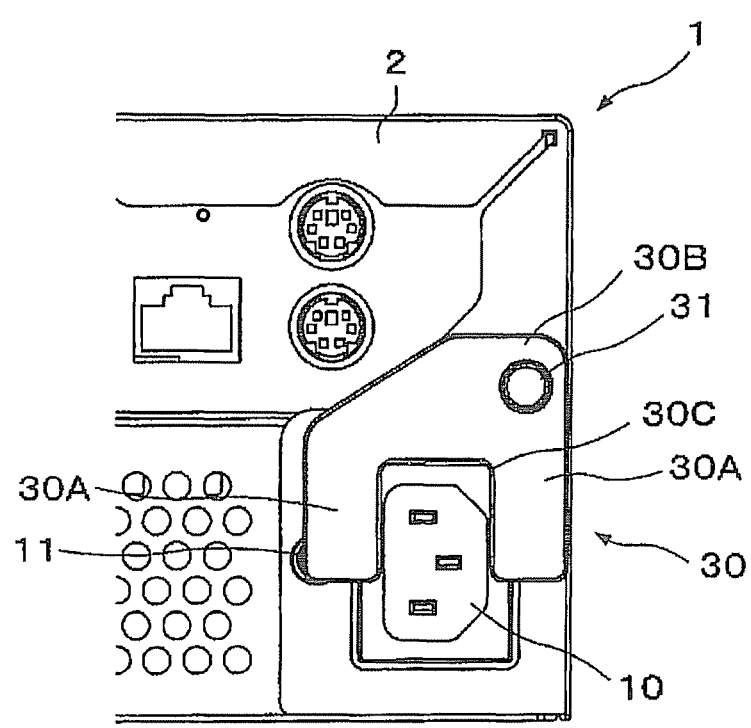
FIG. 8 is a view showing a configuration where a covering member covers a locking member according to a second embodiment.

FIG. 8 is a view showing a configuration where a covering member 30 covers a locking member 11 according to the second embodiment. As shown in FIG. 8, the covering member 30 includes first covering parts 30A having a notch 30C which has a width and a height so as to expose an inlet 10, a locking pin 31 which is disposed above the inlet 10 and rotatably locks the covering member 30 to the body or the body cover 2, and a second covering part 30B which is located opposite the first covering parts 30A with the locking pin 31 interposed therebetween.

The first covering parts 30A have a width and a height so as to cover the locking member 11 when the inlet 10 is exposed. The two first covering parts 30A have substantially the same shape. The locking pin 31 is disposed at different distances from the two first covering parts 30A, respectively. In FIG. 8, the locking pin 31 is disposed near the right one of the two opposing first covering parts 30A.

In other words, the covering member 30 is displaced to expose one of the inlet 10 and at least one locking member 11, which should be removed to take off the body cover 2, while covering the other.

Figure 9:
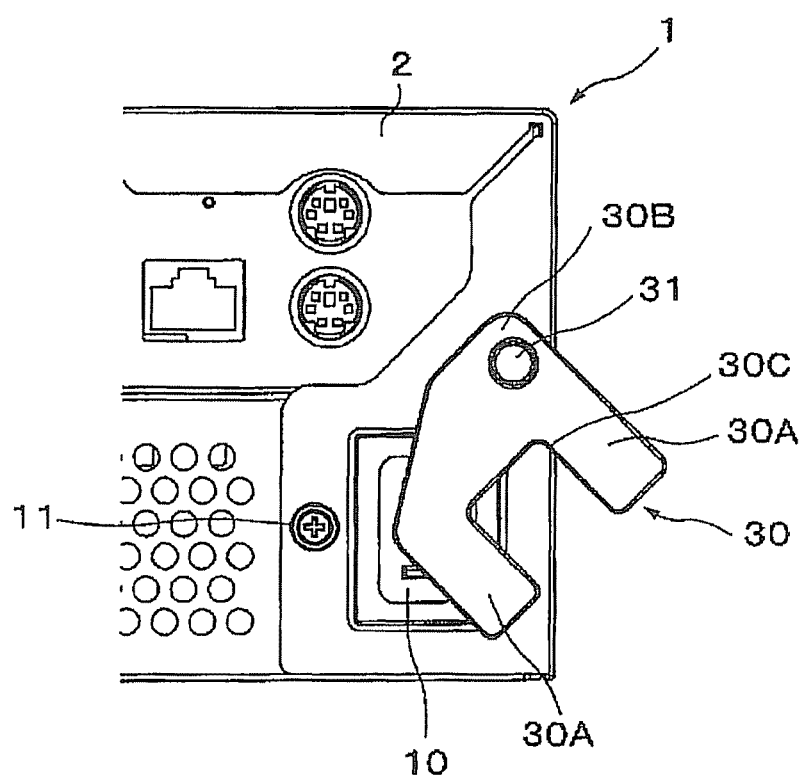
FIG. 9 is a view showing a configuration where the covering member covers an inlet according to the second embodiment.

FIG. 9 is a view showing a configuration where the covering member 30 covers the inlet 10 according to this embodiment. As shown in FIG. 9, if no force is exerted on the covering member 30, the covering member 30 is displaced by virtue of its weight to expose the locking member 11.

The second covering part 30B has a width and a height so as to cover the inlet 10 when the locking member 11 is exposed.

If the locking member 11 is exposed, the first covering parts 30A cover the inlet 10. If the covering member 30 is further rotated and displaced, the first covering parts 30A cover the inlet 10 while the locking member 11 is exposed.

Figure 10:
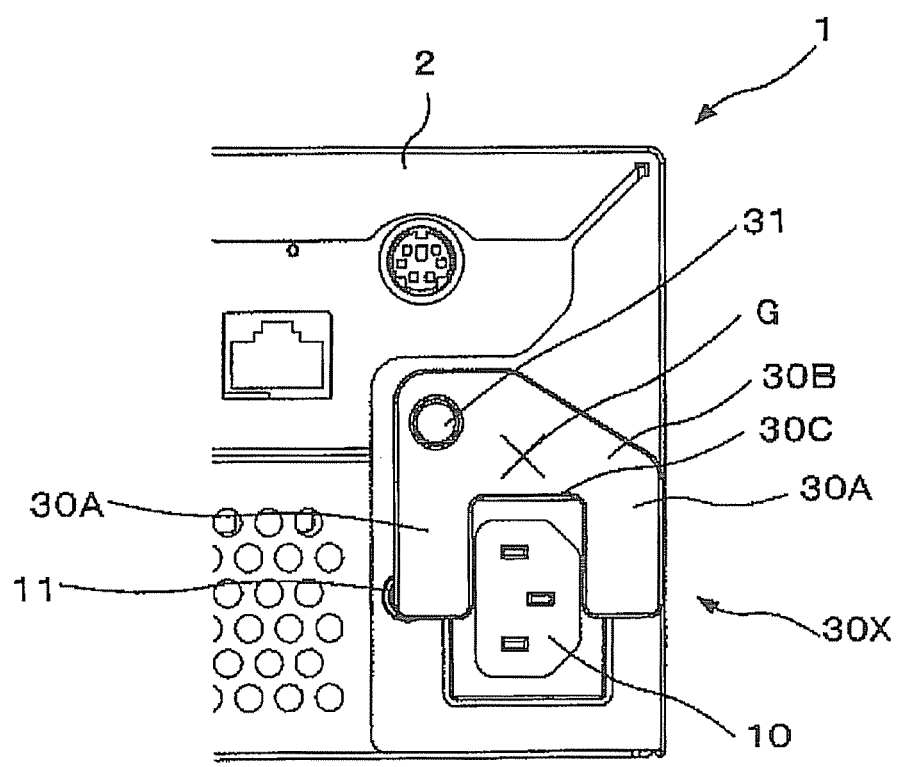
FIG. 10 is a view showing a configuration where a covering member covers a locking member according to a modified example of the second embodiment.

FIG. 10 is a view showing a configuration where a covering member 30X covers a locking member 11 according to a modified example of this embodiment. As shown in FIG. 10, the covering member 30X includes first covering parts 30A, where the center of gravity G of the covering member 30X lies in the outer direction of a housing, i.e., the body, with respect to the locking pin 31.

The covering member 30X includes the first covering parts 30A having a notch 30C which has a width and a height so as to expose the inlet 10, a locking pin 31 which is disposed above the inlet 10 and rotatably locks the covering member 30 to the body or the body cover 2, and a second covering part 30B which is located opposite the first covering parts 30A with the locking pin 31 interposed therebetween.

The first covering parts 30A have widths and heights so as to cover the locking member 11 when the inlet 10 is exposed. The two first covering parts 30A have substantially the same shape. The locking pin 31 is disposed at different distances from the two first covering parts 30A, respectively. In FIG. 10, the locking pin 31 is disposed near the left one of the two opposing first covering parts 30A.

In other words, the covering member 30X is displaced to expose one of the inlet 10 and at least one locking member 11, which should be removed to take off the body cover 2, while covering the other.

Figure 11:
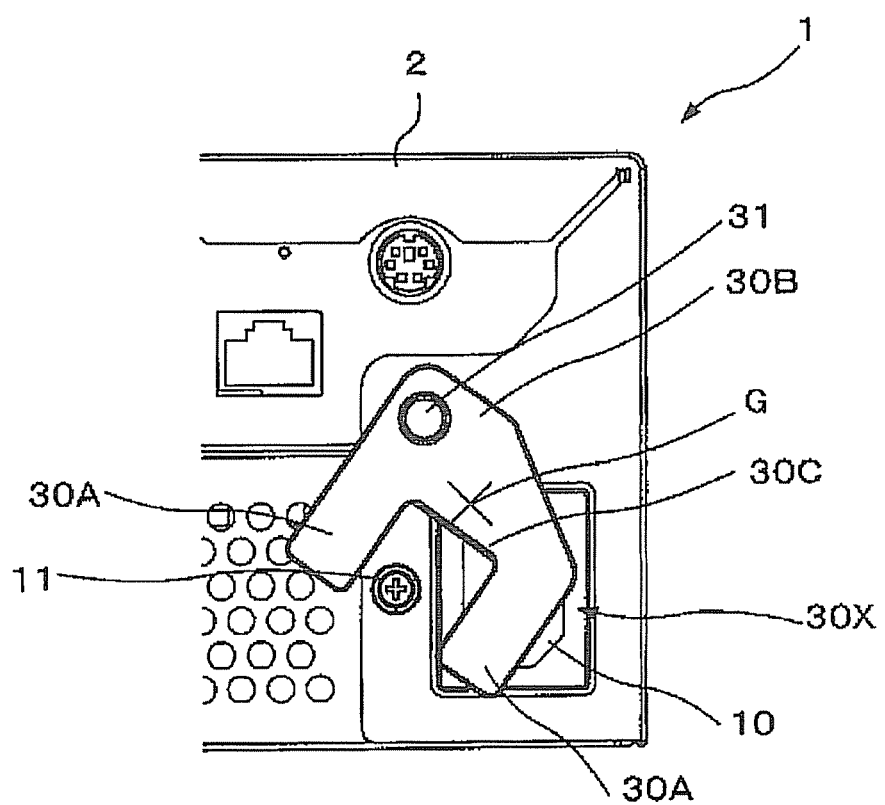
FIG. 11 is a view showing a configuration where a covering member covers an inlet according to the modified example of the second embodiment.

FIG. 11 is a view showing a configuration where a covering member 30X covers an inlet 10 according to a modified example of this embodiment. As shown in FIG. 11, if no force is exerted on the covering member 30X, the covering member 30X is displaced by virtue of its weight to expose the locking member 11.

The second covering part 30B has a width and a height so as to cover the inlet 10 when the locking member 11 is exposed.

If the locking member 11 is exposed, the first covering parts 30A cover the inlet 10. If the covering member 30X is further rotated and displaced, the first covering parts 30A cover the inlet 10 while the locking member 11 is exposed.

In this case, since the center of gravity G of the covering member 30X lies in the outer direction of a housing, i.e., the body, with respect to the locking pin 31, the covering member 30X is rotated such that the center of gravity G is displaced toward the inside of the housing. If the covering member 30X is rotated such that the center of gravity G is displaced toward the inside of the housing, the first covering parts 30A are displaced toward the inside of the housing and thus does not stick out of the housing, i.e., the body.

As described above, the information processing terminal 1 according to this embodiment includes the covering member 30 having the locking pin 31 disposed at different distances from the left and right first covering parts 30A, respectively.

Accordingly, when the power cord is disconnected from the inlet 10, the covering member 30 is displaced by virtue of its weight to expose the locking member 11, which may save an operator labor in displacing the covering member 30.

In addition, the covering member 30X includes the first covering parts 30A configured such that the center of gravity G of the covering member 30X lies in the outer direction of the housing, i.e., the body, with respect to the locking pin 31. Accordingly, when the power cord is disconnected from the inlet 10, the covering member 30X does not stick out of the body even when the covering member 30X is displaced by virtue of its weight.

Third Embodiment

An information processing terminal 1 according to a third embodiment has the same internal configuration as that of the first embodiment, and therefore, explanation of the internal configuration will be omitted for the sake of brevity.

Figure 12:
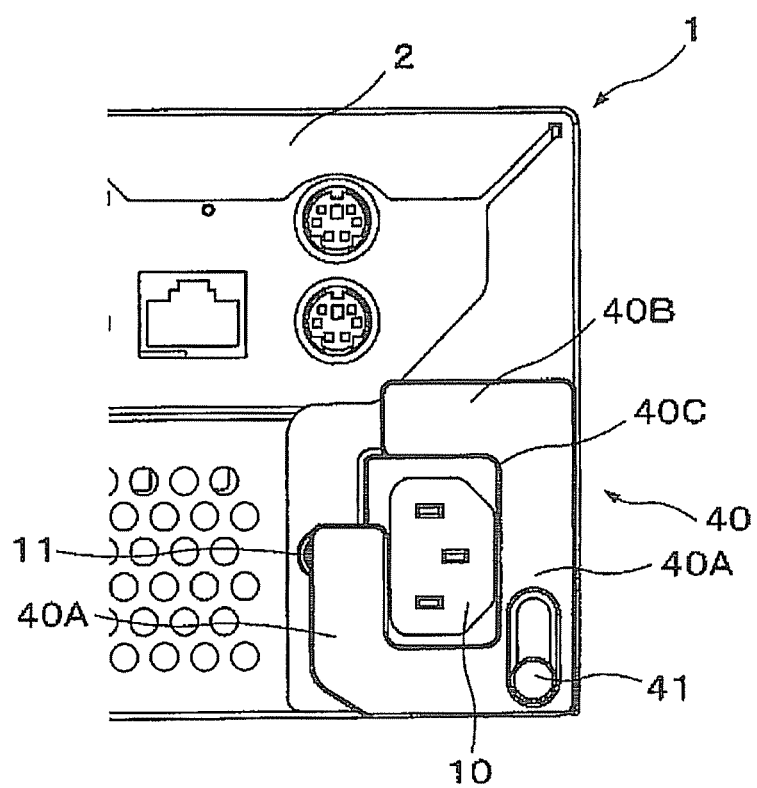
FIG. 12 is a view showing a configuration where a covering member covers a locking member according to a third embodiment.

FIG. 12 is a view showing a configuration where a covering member 40 covers a locking member 11 according to the third embodiment. As shown in FIG. 12, the covering member 40 includes first covering parts 40A having a notch 40C which has a width and a height so as to expose an inlet 10, a locking pin 41 which is disposed beside the inlet 10 and vertically slidably locks the covering member 40 to the body or the body cover 2, and a second covering part 40B which extends across the inlet 10 at a leading end of one of the first covering parts 40A.

At least one of the first covering parts 40A has a width and a height so as to cover the locking member 11 when the covering member 40 is displaced upward to expose the inlet 10.

Figure 13:
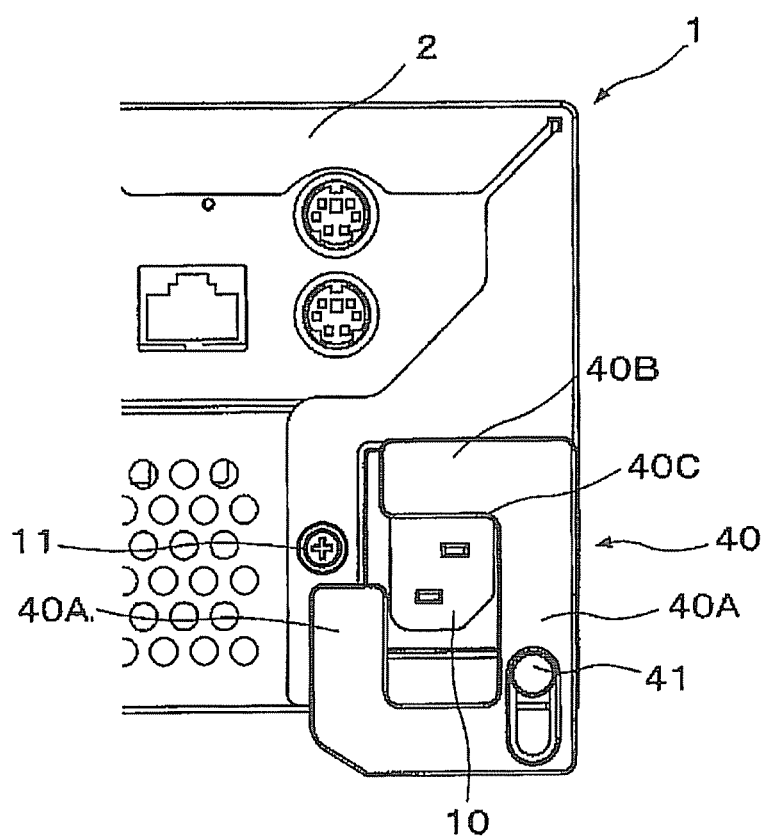
FIG. 13 is a view showing a configuration where the covering member covers an inlet according to the third embodiment.

FIG. 13 is a view showing a configuration where the covering member 40 covers the inlet 10 according to this embodiment. As shown in FIG. 13, the second covering part 40B has a width and a height so as to cover the inlet 10 when the covering member 40 is displaced downward to expose the locking member 11.

In other words, the covering member 40 is displaced to expose one of the inlet 10 and at least one locking member 11, which should be removed to take off the body cover 2, while covering the other.

The covering member 40 is displaced downward by virtue of its weight when the power cord is disconnected from the inlet 10.

As described above, the information processing terminal 1 according to this embodiment includes the covering member 40 which includes the first covering parts 40A which are slidably locked to the body cover 2 and has the notch 40C which has a width and a height so as to expose the inlet 10, the locking pin 41 which is disposed above the inlet 10 and is slidably locked to the body cover 2, and the second covering part 40B which is located at the leading end of one of the first covering parts 40A. In this embodiment, the covering member 40 is displaced to expose one of the inlet 10 and at least one locking member 11, which should be removed to take off the body cover 2, while covering the other.

Since the covering member 40 is displaced downward by virtue of its weight when the power cord is disconnected from the inlet 10, it is possible to achieve good work efficiency.

Fourth Embodiment

An information processing terminal 1 according to a fourth embodiment has the same internal configuration as that of the first embodiment, and therefore, explanation of the internal configuration will be omitted for the sake of brevity.

Figure 14:
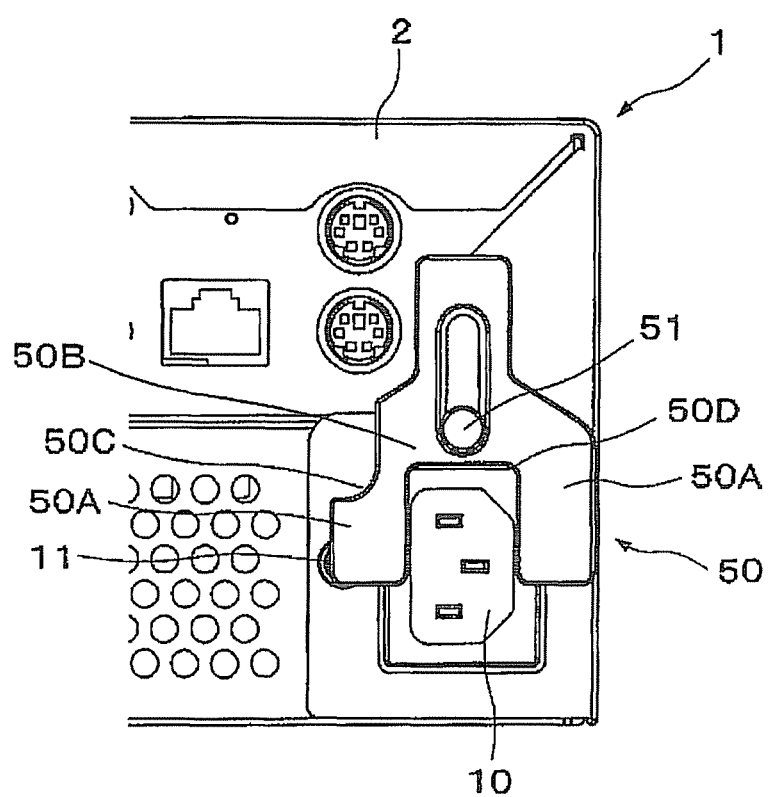
FIG. 14 is a view showing a configuration where a covering member covers a locking member according to a fourth embodiment.

FIG. 14 is a view showing a configuration where a covering member 50 covers a locking member 11 according to the fourth embodiment. As shown in FIG. 14, the covering member 50 includes first covering parts 50A having a notch 50D which has a width and a height so as to expose an inlet 10, a locking pin 51 which is disposed above the inlet 10 and vertically slidably locks the covering member 50 to the body or the body cover 2, and a second covering part 50B which is provided at a root portion of one of the first covering parts 50A.

The first covering parts 50A have widths and heights respectively so as to cover the locking member 11 when the covering member 50 is displaced upward to expose the inlet 10.

The second covering member 50B has a width and a height so as to cover the inlet 10 when the covering member 50 is displaced downward to cover the inlet 10.

Figure 15:
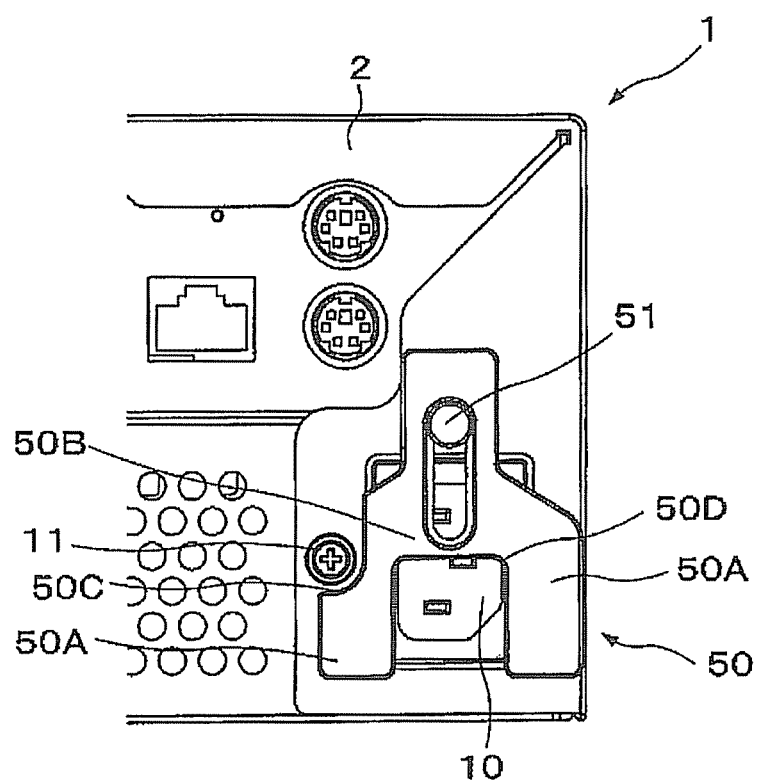
FIG. 15 is a view showing a configuration where the covering member exposes the locking member according to the fourth embodiment.

FIG. 15 is a view showing a configuration where the covering member 50 is displaced to expose the locking member 11 according to this embodiment. As shown in FIG. 15, the first covering parts 50A have a notch 50C which has a width and a height so as to expose the locking member 11 when the covering member 50 is displaced downward to cover the inlet 10.

In other words, the covering member 50 is displaced to expose one of the inlet 10 and at least one locking member 11, which should be removed to take off the body cover 2, while covering the other.

The covering member 50 is displaced downward by virtue of its weight to expose the locking member 11 when the power cord is disconnected from the inlet 10.

As described above, the information processing terminal 1 according to this embodiment includes the covering member 50 which includes the first covering parts 50A which are slidably locked to the body cover 2 and has the notch 50D which has a width and a height so as to expose the inlet 10, the locking pin 51 which is disposed above the inlet 10 and is slidably locked to the body cover 2, and the second covering part 50B which is provided at a root portion of one of the first covering parts 50A. In this embodiment, the covering member 50 is displaced to expose one of the inlet 10 and at least one locking member 11, which should be removed to take off the body cover 2, while covering the other.

Since the covering member 50 is displaced downward by virtue of its weight when the power cord is disconnected from the inlet 10, it is possible to achieve good work efficiency and prevent the covering member 50 from sticking out of the side surface of a housing even when the covering member 50 is displaced by virtue of its weight.

In other words, since the covering member 50 is displaced by virtue of its weight, the locking member 11 is exposed only by disconnecting the power cord from the inlet 10. Accordingly, an operator can immediately remove the locking member 11 to take off the body cover 2. In addition, since the inlet 10 is covered by the second covering part 50B while the locking member 11 is being exposed, the power cord cannot be inserted in the inlet 10. Accordingly, an electric shock can be effectively prevented.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An information processing terminal comprising:
a power supply for supplying electric power;
an inlet connected to a power cord for supplying electric power to the power supply;
an electronic board on which an arithmetic unit is mounted;
a body cover which covers a body including at least the power supply and the electronic board; and
a covering member disposed in the body or the body cover, the covering member being displaced to expose one of the inlet and at least one locking member, which should be removed to take the body cover out of the body, while covering the other.

2. The terminal of claim 1, wherein the covering member comprises:
a first covering part including a notch to expose the inlet when the locking member is covered; and
a second covering part covering the inlet when the locking member is exposed.

3. The terminal of claim 2 wherein the covering member is displaced by virtue of its weight when the power cord is disconnected from the inlet, so that the second covering part covers the inlet while the locking member is exposed.

4. The terminal of claim 3, wherein the first covering part has a notch exposing the locking member when the covering member is displaced to cover the inlet.

5. The terminal of claim 1, wherein the covering member is slidably or rotatably disposed in the body cover.

6. The terminal of claim 5, wherein the covering member is slidably or rotatably locked by a locking pin disposed on a line symmetrical with an axis of the covering member.

7. The terminal of claim 5, wherein the covering member is slidably or rotatably locked by a locking pin above the inlet.

8. The terminal of claim 5, wherein the covering member has a vertically asymmetric shape.

9. The terminal of claim 5, wherein the covering member does not stick out of a side or bottom surface of the body when the second covering part is displaced to cover the inlet while the locking member is exposed.

10. A method for preventing electric shock in an information processing terminal including a power supply for supplying electric power, an inlet connected to a power cord for supplying electric power to the power supply, an electronic board on which an arithmetic unit is mounted, and a body cover covering a body including at least the power supply and the electronic board, the method comprising displacing a covering member to expose one of the inlet and at least one locking member, which should be removed to take off the body cover, while covering the other.

11. The method of claim 10, wherein the covering member is slidably or rotatably movable.

12. A covering structure for use in an information processing terminal, the covering structure comprising:
a covering member when disposed in a first position exposes an inlet of an information processing terminal and covers at least one locking member of the information processing terminal; and
a locking pin which attaches the covering member to the information processing terminal and allows the covering member to be disposed into a second position that covers the inlet and exposes the at least one locking member.

13. The structure of claim 12, wherein the covering member comprises:
a first covering part including a notch to expose the inlet when the locking member is covered; and
a second covering part covering the inlet when the locking member is exposed.

14. The structure of claim 13, wherein the covering member is displaced by virtue of its weight when the power cord is disconnected from the inlet, so that the second covering part covers the inlet while the locking member is exposed.

15. The structure of claim 14, wherein the first covering part has a notch exposing the locking member when the covering member is displaced to cover the inlet.

16. The structure of claim 12, wherein the covering member is slidably or rotatably disposed in the body cover.

17. The structure of claim 16, wherein the covering member is slidably or rotatably locked by a locking pin disposed on a line symmetrical with an axis of the covering member.

18. The structure of claim 16, wherein the covering member is slidably or rotatably locked by a locking pin above the inlet.

19. The structure of claim 16, wherein the covering member has a vertically asymmetric shape.

20. The structure of claim 16, wherein the covering member does not stick out of a side or bottom surface of the body when the second covering part is displaced to cover the inlet while the locking member is exposed.

* * * * *